United States Patent [19]

Sudo et al.

[11] Patent Number: 5,376,558

[45] Date of Patent: Dec. 27, 1994

[54] METHOD OF FABRICATING A SEMICONDUCTOR IMAGE PICKUP DEVICE

[75] Inventors: Gen Sudo; Soichiro Hikida, both of Kawasaki, Japan

[73] Assignee: Fujitsu Limited, Kawasaki, Japan

[21] Appl. No.: 41,462

[22] Filed: Apr. 2, 1993

Related U.S. Application Data

[62] Division of Ser. No. 806,247, Dec. 13, 1991, abandoned.

[30] Foreign Application Priority Data

Dec. 19, 1990 [JP] Japan .................. 2-403723

[51] Int. Cl.⁵ .............................. H01L 31/18
[52] U.S. Cl. ........................ 437/3; 437/50; 437/185
[58] Field of Search .......... 437/2, 3, 50, 53, 185, 437/978; 148/DIG. 43, DIG. 63, DIG. 64, DIG. 81

[56] References Cited

U.S. PATENT DOCUMENTS

| | | | |
|---|---|---|---|
| 4,570,329 | 2/1986 | Paine et al. | 437/3 |
| 4,766,084 | 8/1988 | Bory et al. | 437/185 |
| 4,972,244 | 11/1990 | Buffet et al. | 257/442 |
| 5,188,970 | 2/1993 | York et al. | 437/3 |

*Primary Examiner*—Tom Thomas
*Assistant Examiner*—Chandra Chaudhari
*Attorney, Agent, or Firm*—Staas & Halsey

[57] ABSTRACT

A method for fabricating a semiconductor image pickup device for detecting a light image includes a step of forming an array of detector elements, each of which generates an electronic signal in response to light incident thereto, and a step of forming a light absorbing layer which is situated to optically isolate each of the detector elements. The array of detector elements in the light absorbing layer can be formed on a substrate. In one embodiment, the light absorbing layer is produced by forming a first layer contacting with each of the detector elements which has a first refractive index, forming a second layer contacting with the first layer which has a second refractive index greater than the first refractive index of the first layer, and forming a metal layer contacting with the second layer. By forming the light absorbing layer in this manner, the array of detecting elements can be optically isolated from each other so that problems such as cross-talk, for example, can be reduced.

12 Claims, 6 Drawing Sheets

METHOD OF FABRICATING A SEMICONDUCTOR IMAGE PICKUP DEVICE

This application is a division, of application Ser. No. 07/806,247, filed Dec. 13, 1991, now abandoned.

BACKGROUND OF THE INVENTION

1. Field of the Invention

The present invention relates to a semiconductor infrared detector, and more particularly to an infrared image pickup device comprising a plurality of infrared detector elements forming a photo-sensing substrate. The photo-sensing substrate of the invention provides a light shield layer specially prepared for optically isolating each detector element from adjacent detector elements and further isolating a signal processing substrate from the photo-sensing substrate. Therefore, the device is most suitable for an application in which high resolution is required.

2. Description of the Related Art

Many kinds of semiconductor materials are utilized as a photo-electric conversion element. Among them, semiconductor $Hg_{1-x}Cd_xTe$ is known to have a narrow bandgap and to be a suitable material for an infrared detector. In a semiconductor image pickup device, a plurality of detector elements are arranged either one-dimensionally in a line or two-dimensionally in a matrix. In recent years, in order to obtain a higher resolution of the image pickup device, a distance between adjacent detector elements has been made smaller, which results in causing noise or cross talk problems.

An existing exemplary semiconductor image pickup device having a high sensitivity is illustrated in FIG. 1. The device utilizes photovoltaic infrared detectors of compound semiconductor $Hg_{1-x}Cd_xTe$. The device is composed or two main portions or a photo-sensing substrate 30 and a signal processing substrate 32, and two substrates 30 and 32 are connected together by a plurality of connecting rods 13 (generally called a bump) therebetween.

With regard to an actual structure of the photo-sensing substrate 30, a plurality of infrared detector elements 1 are formed and buried in a CdTe substrate 5. Each detector element 1 comprises a P-type region 6 of compound semiconductor $Hg_{1-x}Cd_xTe$ and an N-type region 7 of $Hg_{1-x}Cd_xTe$ buried therein. With regard to the signal processing substrate 32, a plurality of diodes 14 are formed in s P-type silicon substrate 4, and the diode 14 is formed by a buried N-type region and a surrounding P-type silicon substrate region. Each N-type region 7 of the photo-sensing substrate 30 and each diode 14 of the signal processing substrate 32 are connected with a bump 13 of indium (In). The P-type regions 6 of the photo-sensing substrate 30 are connected together by a metal wiring layer 12, which forms a common electrode of the detector elements 1.

In the infrared image pickup device of the prior art, no light shield (or light absorber) is provided around an isolation region 2 between the adjacent detector elements 1, therefore, incident rays having the direction shown by arrows A cause irregular reflections from interfaces or the metal wiring layer 12 on the photo-sensing substrate 30. Some of the infrared rays penetrate through the photo-sensing substrate 30 and reach the surface of the signal processing substrate 32, and are reflected back therefrom. The above reflected rays, so-called stray rays, enter into the nearby detector element 1 and sensed therein as noise. All these phenomena deteriorate an S/N ratio and the aimed resolution of infrared image pickup device can not be obtained.

In order to reduce the generation of needless stray rays and to avoid the cross talk problem, the following two Japanese Unexamined Patents have been disclosed.

Japanese Unexamined Patent Publication SHO 63-296272 published Dec. 2, 1988 discloses the method, in which a metal layer of gold (Au) 12 is formed on the surface of a photo-sensing substrate 30 except the surface of an N-type region 7 of the detector elements 1, and a substantial portion of a CdTe substrate 5 is etched away, which reduces the noise problem and further eliminates a thermal trouble caused by a difference in thermal expansion between the CdTe substrate 5 and the silicon substrate 4.

Japanese Unexamined Patent Publication HEI 1-201971 published Aug. 14, 1989 discloses that a photo-sensing substrate 30 comprises a buffer layer and infrared detector elements are not buried in a photo-sensing substrate 30 but each detector element has a mesa shape which is formed on the buffer layer and protrudes toward a signal processing substrate 32. The surface of an isolation region 2, in other words, the bottom surface between detector elements (mesas) is covered with a light shield layer. The light shield layer is composed of two layers, i.e., a first layer of zinc sulphide (ZnS) and a second layer of chromium (Cr).

SUMMARY OF THE INVENTION

It is an object of the present invention to provide a semiconductor image pickup device which has high resolution by reducing stray rays.

A basic structure of a semiconductor image pickup device of the invention is similar to that applied in the prior art, namely, the device comprises a photo-sensing substrate and a signal processing substrate, in which the photo-sensing substrate comprises a plurality of detector elements and the signal processing substrate comprises a plurality of input diodes. Each detector element is operatively connected by a bump to the respective input diode of the signal processing substrate.

In accordance with the image pickup device of the present invention, the photo-sensing substrate is completely shielded from the signal processing substrate by a light shield layer, and further each detector element is isolated from each other as much as possible. In one embodiment, the photo-sensing substrate is covered by the shield layer except for an input port of the detector element for receiving incident rays, and more particularly, the light shield layer of the invention is composed of an insulation layer and a metal layer, and further the insulation layer is of a multi-layer structure composed of silicon nitride and zinc sulphide layers.

BRIEF DESCRIPTION OF THE DRAWINGS

Throughout the drawings, the same reference numerals designate and identify the same or similar parts.

DETAILED DESCRIPTION OF THE PREFERRED EMBODIMENTS

Figure 2:
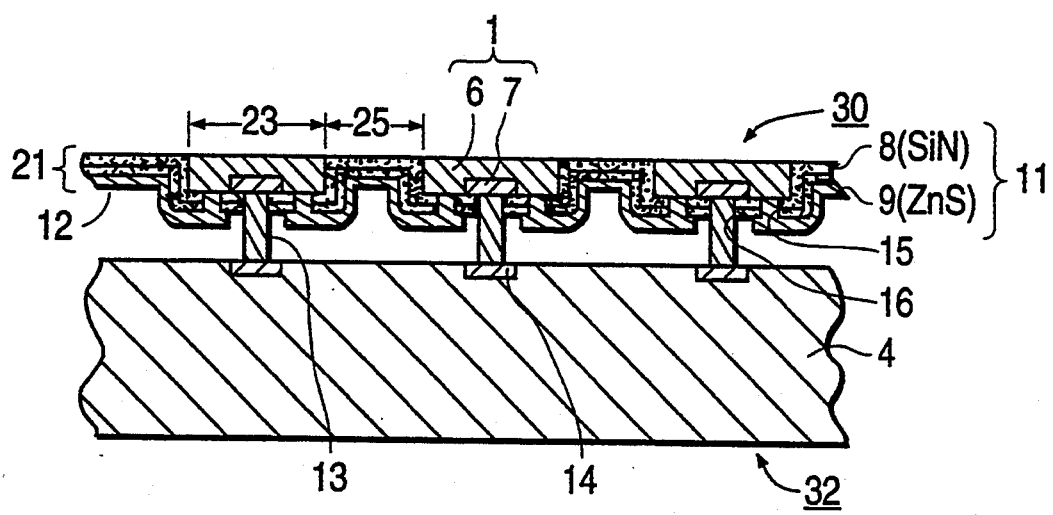
FIG. 2 shows a schematic cross section of a first embodiment or the present invention.

FIG. 2 shows a schematic cross section of a first embodiment of a semiconductor infrared image pickup device in accordance with the present invention. A plurality of detector elements 1 are arranged forming a main portion of a photo-sensing substrate 30. The detector element 1 comprises a P-type $Hg_{1-x}Cd_xTe$ crystalline region 6 and an N-type $Hg_{1-x}Cd_xTe$ region 7, which is formed by doping boron ion (B+) impurities into the P-type $Hg_{1-x}Cd_xTe$ region 6. Each detector element 1 is insulated from neighboring detector elements by a double insulation layer 11 composed of a silicon nitride (SIN) layer 8 and a zinc sulphide (ZnS) layer 9.

A metal layer 12 of aluminum (AL) covers the insulation layer 11. The metal layer 12 and the double insulation layer 11 form a light shield layer 21 of the present invention, and the shield layer 21 covers an outer surface of the P-type crystalline region 6 except a light input port 23. Holes 15 and 16 are formed through the insulation layer 11, and the metal layer 12 is in contact with the P-type crystalline region 6 through the hole 15, and a bump is formed through the hole 16.

A signal processing substrate 32 has a well known structure of a charge coupled device (CCD) using a silicon substrate, therefore, details thereof are omitted and only an input diode 14 is shown in FIG. 2.

The photo-sensing substrate 30 is assembled with the signal processing substrate 32 using a bump 13 and forms a completed infrared image pickup device of the invention. The bump 13 is made of indium (In) and connects the N-type $Hg_{1-x}Cd_xTe$ region 7 to the input diode 14. In the actual fabrication, resin (not shown) is further added in the space between the photo-sensing substrate 30 and the signal processing substrate 32.

Figure 3:
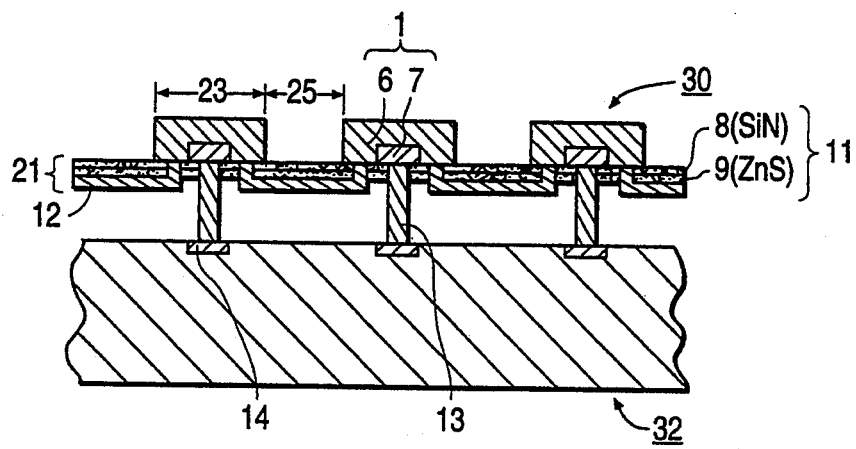
FIG. 3 shows a schematic cross section of a second embodiment of the present invention.

FIG. 3 shows a schematic cross section of a second embodiment of a semiconductor infrared image pickup device in accordance with the present invention. A photo-sensing substrate 30 is different from the photo-sensing substrate 30 of FIG. 2 in that a plurality of infrared detector elements 1 are isolated from each other and protruding on a flat light shield layer 21 forming isles. A signal processing substrate 32 and connecting bumps 13 are the same as those shown in FIG. 2. The light shield layer 21 is composed of a silicon nitride (SIN) layer 8, a zinc sulphide (ZnS) layer 9 and a metal layer 12 of aluminum, laminated in this order from the light input side.

When the infrared image pickup device of FIGS. 2 and 3 receives infrared rays, a photo-electromotive force is induced in each detector element 1 of the photo-sensing substrate 30. Incident infrared rays to each light input port 23 induce photo-electromotive force in the respective detector element. Each detector element of FIG. 2 is insulated and optically isolated from the neighboring detector elements by the light shield layer 21, and each detector element of FIG. 3 is completely separated from the neighboring elements, therefore, stray rays of the prior art which flow into the nearby detector element and cause deterioration of resolution can be avoided.

Infrared rays which are incident to a region 25 which occupies the boundary region between adjacent light input ports 23, penetrate into the SiN layer 8 and ZnS layer 9 of the insulation layer 11, are thereby partly attenuated and reflected, and are finally reflected from the metal layer 12. The incident rays and the reflected rays cause a complex interference with each other, and an apparent overall reflectance of the light shield layer 21 is remarkably reduced proper thickness and refraction index are utilized for each layer of the insulation layer 11. It is preferable that refraction index $n_1$ of the first layer is less than refraction index $n_2$ of the second layer in order to reduce reflection. In the embodiment, $n_1$ of the SiN layer (approx. 2.0) is less than $n_2$ of the ZnS layer (approx. 2.2). Generally, the materials used for the insulation layer need to satisfy the following relation;

$$n_2 > n_1 > n_0,$$

herein $n_0$ denotes the refraction index of air which is equal to 1.

Figure 4:
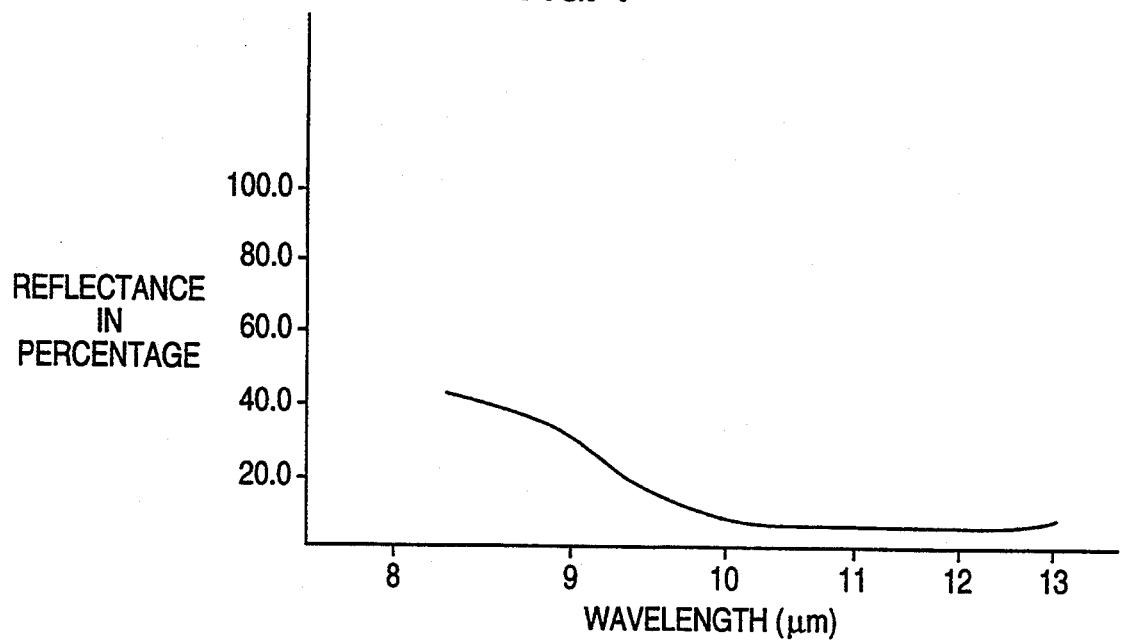
FIG. 4 is a graph showing relations between reflectance ( in percentage) and incident light wavelength onto a light shield layer of the present invention.

The effect of the light shield layer 21 is tested using the insulation layer 11 formed on the aluminum layer 12, in which the insulation layer is of the SiN layer 8 having 400 nm in thickness and the ZnS layer 9 having 1 μm in thickness. A reflectance therefrom is measured by changing wavelength of the incident light, the results are shown in FIG. 4. Reflectance less than 5% can be obtained for a wavelength range of 10 to 12 μm.

In the embodiments of FIGS. 2 and 3, incident rays onto the region 23 cause extremely small effect to the adjacent detector elements 1 due to small reflection from the light shield layer 21. Further, incident rays can not penetrate through the light shield layer 21 due to the existence of the metal layer 12. Therefore, stray rays can not exist between the photo-sensing substrate 30 and the signal processing substrate 32.

Figure 1:
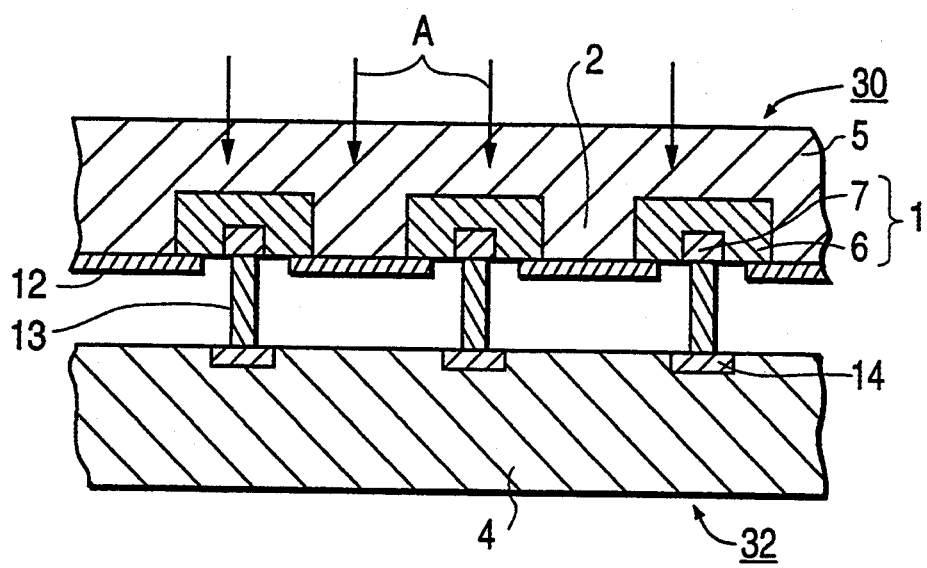
FIG. 1 shows a schematic cross section of a semiconductor image pickup device of the prior art.

Next, fabrication methods of the first and second embodiments are explained, in which all figures are illustrated upside-down compared with FIGS. 1 to 3 for the purpose of convenience.

Figure 5A:
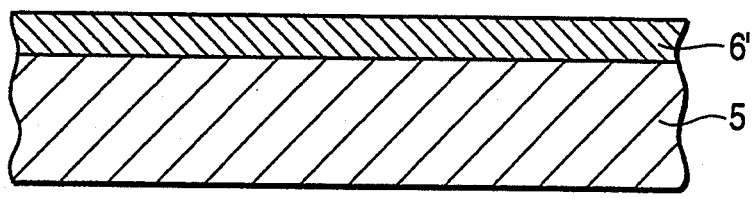
FIGS. 5(a), 5(b), 5(c), 5(d), and 5(e) show cross sections at sequential steps in fabrication of the first embodiment of the present invention.
Figure 5B:
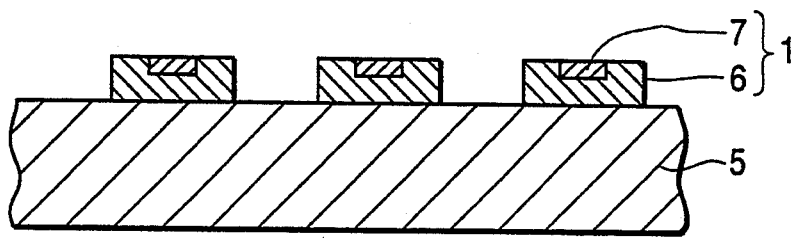

With regard to the fabrication of the first embodiment of FIG. 2, a P-type $Hg_{1-x}Cd_xTe$ 6' is grown epitaxially on a CdTe substrate 5 as shown in FIG. 5(a) by a vapor-phase or liquid-phase method, the thickness thereof being selected to be about 30 μm. Forming a resist layer (not shown) on the $Hg_{1-x}Cd_xTe$ layer 6', the substrate is subjected to a plasma etching process or an ion milling process, resulting In forming an isle-like mono-crystalline $Hg_{1-x}Cd_xTe$ region 6 of FIG. 5(b). After forming another resist mask (not shown), boron ions (B+) are implanted into the $Hg_{1-x}Cd_xTe$ region 6 forming an N-type $Hg_{1-x}Cd_xTe$ region 7, which results in forming a detector element 1.

Figure 5C:
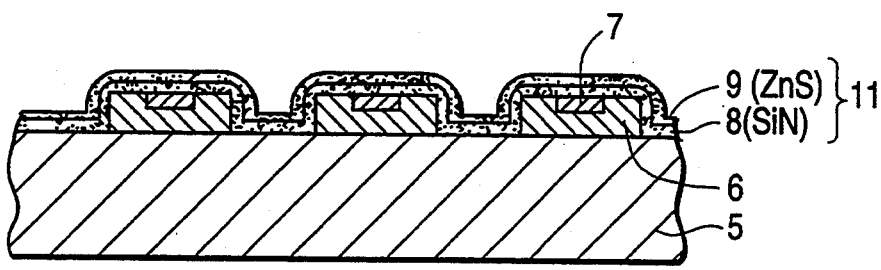

In FIG. 5(c), the entire surface of the substrate is deposited with a SiN layer 8 of about 0.4 μm in thickness by a CVD method, preferably, ECR (Electron Cyclotron Resonance) plasma CVD method. Thereafter the entire SiN surface is deposited with a ZnS layer 9 of about 1.0 μm in thickness by a vacuum sputtering method. Two layers of SiN 8 and ZnS 9 form an insulation layer 11 of the present invention.

Figure 5D:
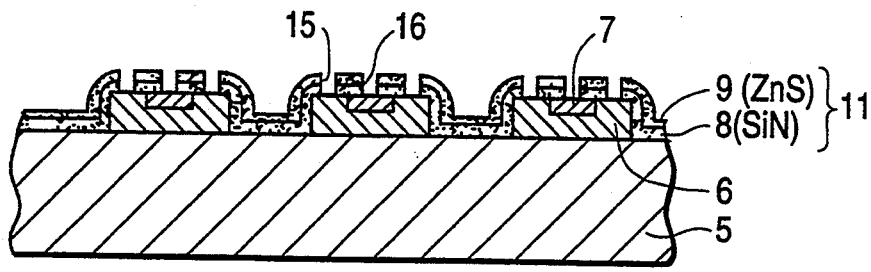

In FIG. 5(d), the insulation layer 11 is selectively patterned with the result of forming contact holes 15 and 16 for the P-type $Hg_{1-x}Cd_xTe$ region 6 and the N-type $Hg_{1-x}Cd_xTe$ region 7 respectively. The contact hole 15 is deposited and buried with gold (Au) and the contact hole 16 is deposited with indium (In) by a deposition method.

Figure 5E:
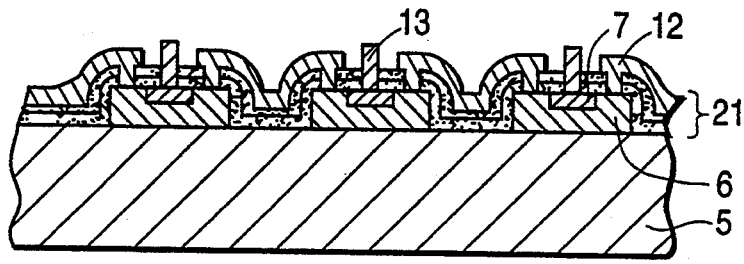

Next, in FIG. 5(e), a metal layer 12 of aluminum (Al) is selectively deposited on the insulation layer 11, to form a contact between the metal layer 12 and the buried Au in the contact hole 15. An indium bump 13 is grown above the N-type $Hg_{1-x}Cd_xTe$ region 7, and thereafter a signal processing substrate 32 which is separately fabricated, is fixed using resin material such that the bump 13 is in contact with an input diode 14 of the signal processing substrate 32. Finally, the CdTe substrate 5 is removed by etching, completing fabrication of the image pickup device of FIG. 2 of the invention.

Figure 6A:
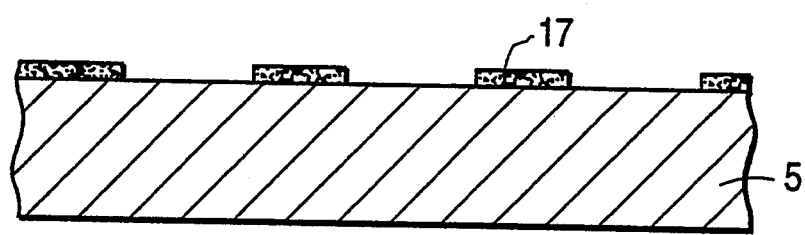
FIGS. 6(a), 6(b), 6(c), 6(d), 6(e), and 6(f) show cross sections at sequential steps in fabrication of tile second embodiment of the present invention.
Figure 6B:
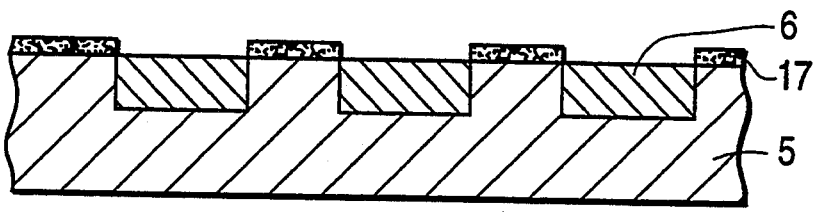

Next, a fabrication method of the second embodiment of FIG. 3 is explained. In FIG. 6(a), a silicon dioxide ($SiO_2$) layer 17 is formed on a CdTe substrate 5 by a CVD method and $SiO_2$ layer 17 is patterned. Using the $SiO_2$ layer 17 as a mask, the CdTe substrate 5 is exposed to the ambient conditions of Te-rich $Hg_{1-x}Cd_xTe$ melt and the temperature of the substrate 5 is kept at about 550° C. for a predetermined time. This process results in forming a buried P-type $Hg_{1-x}Cd_xTe$ region 6 in the CdTe substrate 5 as shown in FIG. 6(b).

Figure 6C:
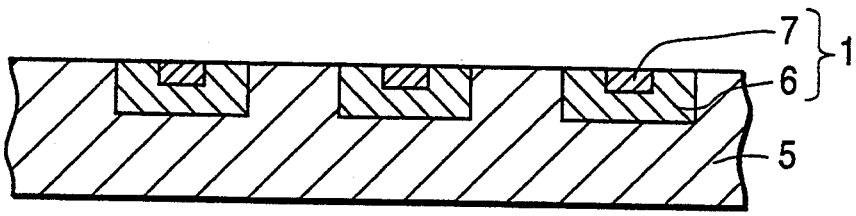

After removing $SiO_2$ mask 17, a resist mask is formed and patterned (not shown) on the substrate. Boron ions are implanted forming an N-type $Hg_{1-x}Cd_xTe$ region 7 as shown in FIG. 6(c). A PN junction is formed between P-type $Hg_{1-x}Cd_xTe$ region 6 and the N-type $Hg_{1-x}Cd_xTe$ region 7, and both regions form a detector element 1.

Figure 6D:
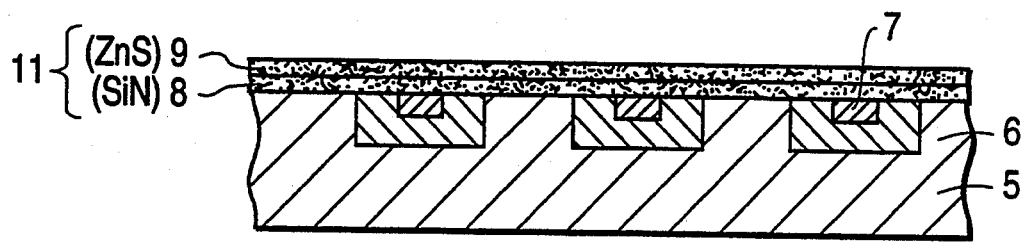

In FIG. 6(d), a SiN layer 8 having a thickness of about 0.4 μm is formed on the entire substrate and thereafter a ZnS layer 9 having a thickness or about 1.0 μm is formed thereon in the similar way as in the first embodiment.

Figure 6E:
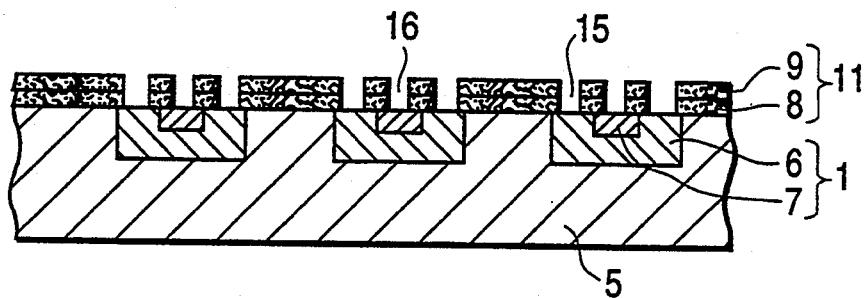
Figure 6F:
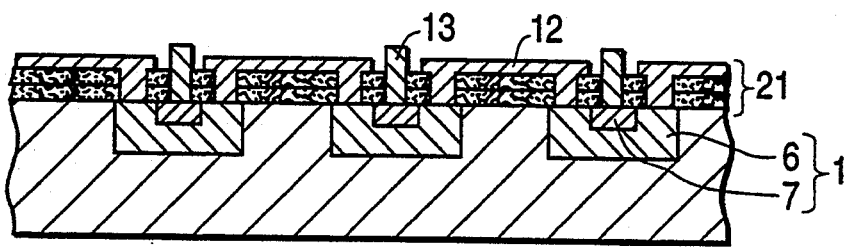

The subsequent processes are completely the same as applied for the first embodiment, therefore the details are omitted. In FIG. 6(e), contact holes 15 and 16 are formed. In FIG. 6(f), a metal layer 12 and a bump 13 are formed. After the photo-sensing substrate 30 thus fabricated is assembled with a signal processing substrate 32, the CdTe substrate 5 is removed. Fabrication of the image pickup device of FIG. 3 of the present invention is finished.

The present invention may be embodied in other specific forms. The presently disclosed embodiments are, therefore, to be considered in all respects as illustrative and not restrictive, the scope of the invention being indicated by the appended claims, rather than the foregoing description, all changes which come within the meaning and range of equivalence of the claims are, therefore, to be embraced therein.

What is claimed is:

1. A method of fabricating a semiconductor image pickup device including a photo-sensing substrate and a signal processing substrate, the photo-sensing substrate including a plurality of detector elements, and the signal processing substrate including a plurality of input diodes, each of the detector elements being operatively connected to a respective input diode, the detector elements having respective front surfaces to receive an incident light, said method comprising the sequential steps of:

(a) forming a plurality of semiconductor detector elements, each of the detector elements being separated from each other and having first and second semiconductor regions, (b) forming first and second insulation layers covering back surfaces of the detector elements and areas of the photo-sensing substrate between the detector elements, (c) forming first and second holes through the first and second insulation layers, the first hole exposing a portion of the first semiconductor region and the second hole exposing a portion of the second semiconductor region, (d) depositing a metal layer covering the second insulation layer except for the portion of the second semiconductor region, so that the metal layer contacts with the first semiconductor region through the first hole, (e) forming a bump on the second semiconductor region through the second hole, and (f) joining the photo-sensing substrate formed in the steps (a) through (e) with the signal processing substrate, so that the front surfaces of the detector elements are exposed to receive the incident light.

2. A method of fabricating a semiconductor image pickup device including a photo-sensing substrate and a signal processing substrate, the photo-sensing substrate including a plurality of detector elements, and the signal processing substrate including a plurality of input diodes, each of the detector elements being operatively connected to a respective input diode, the detector elements having respective front surfaces to receive an incident light, said method comprising the sequential steps of:

(a) forming the detector elements buried in the photo-sensing substrate, each of the detector elements being separated by areas of the photo-sensing substrate and having first and second semiconductor regions, the front surfaces of the detector elements being exposed to receive the incident light, (b) forming first and second insulation layers covering back surfaces of the detector elements and areas of the photo-sensing substrate between the detector elements, (c) forming first and second holes through the first and second insulation layers to expose portions of the first and second semiconductor regions, respectively, (d) forming a metal layer covering the second insulation layer except for the exposed portion of the second semiconductor region, to contact with the first semiconductor region, (e) forming a bump on the second semiconductor region through the second hole, and (f) joining the photo-sensing substrate formed in the steps (a) through (e) with the signal processing substrate, and removing a first portion of the photo-sensing substrate to expose the front surfaces of the detector elements to receive incident light, the detector elements being included in a second portion of the photo-sensing substrate remaining after removal of the first portion.

3. A method of fabricating a semiconductor image pickup device as recited in claim 1, wherein said step (b) of forming the first and second insulation layers includes a first substep of forming a silicon nitride layer and a second substep of forming a zinc sulphide layer.

4. A method of fabricating a semiconductor image pickup device as recited in claim 2, wherein said step (b) of forming the first and second insulation layers includes a first substep of forming a silicon nitride layer and a second substep of forming a zinc sulphide layer.

5. A method for making a semiconductor image pickup device for detecting light, comprising the steps of:
   a) forming an array of detector elements, each of the detector elements capable of generating an electronic signal in response to light incident thereto;
   b) forming a SiN layer contacting with each of the detector elements;
   c) forming a ZnS layer contacting with the SiN layer; and
   d) forming a metal layer contacting with the ZnS layer.

6. A method for making a semiconductor image pickup device as recited in claim 5, wherein the semiconductor image pickup device is formed on a substrate, and wherein said step (a) includes the substeps of:
   a1) forming a first region having a first conduction-type for each of the detector elements; and
   a2) forming in the first region, a second region of a second conduction-type for each of the detector elements.

7. A method for making a semiconductor image pickup device for detecting light, comprising the steps of:
   a) forming an array of detector elements, each of the detector elements capable of generating an electronic signal in response to light incident thereto, said step (a) including the substeps of
   a1) forming a first region having a first conduction-type for each of the detector elements, the first regions being formed separated from each other; and
   a2) forming in the first region, a second region of a second conduction-type for each of the detector elements; and
   b) forming a light shield layer to optically isolate each of the detector elements.

8. A method of fabricating a semiconductor image pickup device, comprising the steps of:
   a) forming separate P-type $Hg_{1-x}Cd_xTe$ regions on a CdTe substrate;
   b) forming N-type $Hg_{1-x}Cd_xTe$ regions in respective P-type $Hg_{1-x}Cd_xTe$ regions;
   c) forming an SiN layer over a surface including the P-type $Hg_{1-x}Cd_xTe$ substrate;
   d) forming a ZnS layer over the SiN layer; and
   e) forming first openings in the SiN and ZnS layers to expose the P-type $Hg_{1-x}Cd_xTe$ regions;
   f) forming a metal layer over the ZnS layer, the metal layer contacting with the P-type $Hg_{1-x}Cd_xTe$ regions;
   g) forming second openings in respective areas not covered by the metal layer, through the SiN and ZnS layers to expose the N-type $Hg_{1-x}Cd_xTe$ regions; and
   h) forming metal bumps to contact with the N-type $Hg_{1-x}Cd_xTe$ regions.

9. A method as recited in claim 8, further comprising the step of:
   i) removing the CdTe substrate.

10. A method as recited in claim 8, further comprising the step of:
    i) removing a portion of the CdTe substrate not including the P-type $Hg_{1-x}Cd_xTe$ regions and the N-type $Hg_{1-x}Cd_xTe$ regions.

11. A method as recited in claim 8, wherein the metal bumps include indium.

12. A method as claimed in claim 8, wherein the metal bumps are joined to respective input diodes of a signal processing substrate.

* * * * *